United States Patent
Woods et al.

(10) Patent No.: US 11,699,091 B2
(45) Date of Patent: Jul. 11, 2023

(54) QUBIT CIRCUITS WITH DEEP, IN-SUBSTRATE COMPONENTS

(71) Applicant: Massachusetts Institute of Technology, Cambridge, MA (US)

(72) Inventors: Wayne Woods, Burlington, MA (US); Danna Rosenberg, Arlington, MA (US); Cyrus Hirjibehedin, Newton, MA (US); Donna-Ruth Yost, Action, MA (US); Justin Mallek, Burlington, MA (US); Andrew Kerman, Arlington, MA (US); Mollie Schwartz, Cambridge, MA (US); Jonilyn Yoder, Billerica, MA (US); William Oliver, Arlington, MA (US); Thomas Hazard, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 69 days.

(21) Appl. No.: 17/140,741

(22) Filed: Jan. 4, 2021

(65) Prior Publication Data

US 2022/0121978 A1    Apr. 21, 2022

Related U.S. Application Data

(60) Provisional application No. 62/984,061, filed on Mar. 2, 2020.

(51) Int. Cl.
*G06N 10/00*     (2022.01)
*H10N 60/82*     (2023.01)
(Continued)

(52) U.S. Cl.
CPC .......... *G06N 10/00* (2019.01); *H10N 60/815* (2023.02); *H10N 60/82* (2023.02); *B82Y 10/00* (2013.01); *B82Y 40/00* (2013.01)

(58) Field of Classification Search
CPC ........ G06N 10/00; G06N 10/40; H01L 27/18; H01L 39/223
See application file for complete search history.

(56) References Cited

U.S. PATENT DOCUMENTS

| | | | |
|---|---|---|---|
| 2013/0293292 A1* | 11/2013 | Droege | G11C 5/063 327/565 |
| 2015/0194345 A1* | 7/2015 | Chen | H01L 23/481 257/774 |

(Continued)

OTHER PUBLICATIONS

Alfaro et al. "Fabrication of Al-based superconducting high-aspect ratio TSVs for quantum 3D integration," 10.1109/MEMS46641. 2020.9056165 Date of Conference: Jan. 18-22, 2020 Date Added to IEEE Xplore: Apr. 6, 2020 (Year: 2020).*

(Continued)

*Primary Examiner* — Matthew L Reames
(74) *Attorney, Agent, or Firm* — Smith Baluch LLP

(57) ABSTRACT

Qubit circuits having components formed deep in a substrate are described. The qubit circuits can be manufactured using existing integrated-circuit technologies. By forming components such as superconducting current loops, inductive, and/or capacitive components deep in the substrate, the footprint of the qubit circuit integrated within the substrate can be reduced. Additionally, coupling efficiency to and from the qubit can be improved and losses in the qubit circuit may be reduced.

25 Claims, 10 Drawing Sheets

(51) Int. Cl.
*H10N 60/81* (2023.01)
*B82Y 10/00* (2011.01)
*B82Y 40/00* (2011.01)

(56) References Cited

U.S. PATENT DOCUMENTS

| | | | |
|---|---|---|---|
| 2015/0372217 A1* | 12/2015 | Schoelkopf, III | H01L 39/02 505/413 |
| 2017/0287781 A1* | 10/2017 | Karnik | H01L 23/528 |
| 2019/0165237 A1 | 5/2019 | Hertzberg et al. | |
| 2019/0237649 A1 | 8/2019 | Brink et al. | |

OTHER PUBLICATIONS

International Search Report in Written Opinion in International Patent Application No. PCT/US2021/012064 dated Mar. 25, 2021, 13 pages.

Rosenberg et al., "3D integrated superconducting qubits." arXiv preprint arXiv:1706.04116 (2017). 6 pages.

Vahidpour et al., "Superconducting through-silicon vias for quantum integrated circuits" arXiv preprint arXiv:1708.02226 (2017). 5 pages.

Yost et al., "Solid-state qubits integrated with superconducting through-silicon vias." arXiv preprint arXiv:1912.10942 (2019). 9 pages.

Yost et al., "Solid-state qubits integrated with superconducting through-silicon vias." npj Quantum Information 6.1 (2020): 1-7.

\* cited by examiner

QUBIT CIRCUITS WITH DEEP, IN-SUBSTRATE COMPONENTS

CROSS-REFERENCE TO RELATED APPLICATION

The present application claims a priority benefit, under 35 U.S.C. § 119(e), to U.S. Application No. 62/984,061 filed on Mar. 2, 2020, titled "Through-Silicon Via Qubit," which application is incorporated herein by reference in its entirety.

GOVERNMENT SUPPORT

This invention was made with government support under FA8702-15-D-0001 awarded by the U.S. Air Force. The government has certain rights in the invention.

BACKGROUND

Quantum computing offers the ability to increase the speed of complex machine-based computations by orders of magnitude. A quantum computer encodes information in quantum bits, or qubits. Unlike the binary-state bit that is used for computations in conventional computers, a qubit can be in so-called superposition states of two quantum-mechanical states. The superposition states exhibit finite probabilities of the qubit being in both a ground state and an excited state, and a qubit can be placed in any number of superposition states. The qubit's ability to be in superposition states allows a quantum computer's processing power to increase exponentially with each added qubit as compared to a conventional computer's processing power, which increases linearly with each added bit.

Qubits have been implemented in several ways. Some qubits are formed using microwave free-space resonators that couple with antennas to Josephson junctions patterned in an integrated circuit. Some qubits use atomic vacancies in a crystal lattice for the quantum-mechanical two-state system. Some qubits are based on photon polarization. Although qubits that are manufactured using integrated circuit (IC) components may be larger than atomic vacancies in crystals and photons, IC-based qubits can take advantage of decades of development of semiconductor manufacturing and miniaturization technologies. Additionally, since the qubit is addressed, manipulated, and read out, components that perform these interfacing functions may be appreciably larger than atomic vacancies and photons.

SUMMARY

The described embodiments relate to qubit circuits formed on a substrate using integrated circuit components. These qubit circuits (sometimes referred to as simply "qubits", where the meaning is understood from the context in which the term is used) include deep, in-substrate components that are formed using deep-substrate cavities, such that the qubit can be considered a three-dimensional (3D) circuit device as opposed to a planar, two-dimensional (2D) IC device. The deep in-substrate components can provide capacitive and/or inductive coupling to other deep, in-substrate components during operation of the qubit circuits, among other functionalities. By forming components deep into the substrate, the footprint of the qubit circuit integrated within the substrate can be reduced to allow an increase in density of qubits integrated within a substrate. The term "integrated within" is used to describe an integrated circuit that can have components formed on a surface of a substrate as well as components formed deep in the substrate.

Some implementations relate to a qubit circuit for preparing quantum states for quantum computing. The qubit circuit can include a substrate and a circuit element formed, at least in part, from a superconducting material patterned on the substrate. The qubit circuit can further include a first conductor electrically connected to the circuit element and deposited in a first cavity that extends into the substrate. The first cavity can have an aspect ratio between 5:1 and 100:1, wherein the aspect ratio is a ratio of a depth of the first cavity into the substrate to a smallest transverse dimension of the first cavity.

Some implementations relate to a circuit for quantum computing. The circuit can include a silicon substrate, a Josephson junction formed on the silicon substrate, and a first cavity that extends into the silicon substrate and has an aspect ratio between 5:1 and 100:1, wherein the aspect ratio is a ratio of a depth of the first cavity into the silicon substrate to a smallest transverse dimension of the first cavity. The circuit can further include a capacitive component comprising a first conductor deposited in the first cavity and electrically connected to the Josephson junction, a second cavity that extends into the silicon substrate and has an aspect ratio between 5:1 and 100:1, and a second conductor deposited in the second cavity and electrically connected to a readout resonator. The second conductor can capacitively couple to the first conductor when the circuit is operating, and the first conductor and the second conductor can be formed from a superconducting material.

Some implementations relate to a method of operating a qubit circuit for quantum computing. The method can comprise acts of applying first electromagnetic energy to a qubit circuit that includes a circuit component formed, at least in part, from a superconducting material, wherein the circuit component is formed on a substrate, and delivering at least some of the first electromagnetic energy to a first conductor deposited in a first cavity that extends into the substrate and is electrically connected to the circuit component. The first cavity may have an aspect ratio between 5:1 and 100:1, wherein the aspect ratio is a ratio of a depth of the first cavity into the substrate to a smallest transverse dimension of the first cavity.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. The terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar components).

DETAILED DESCRIPTION

Figure 1:
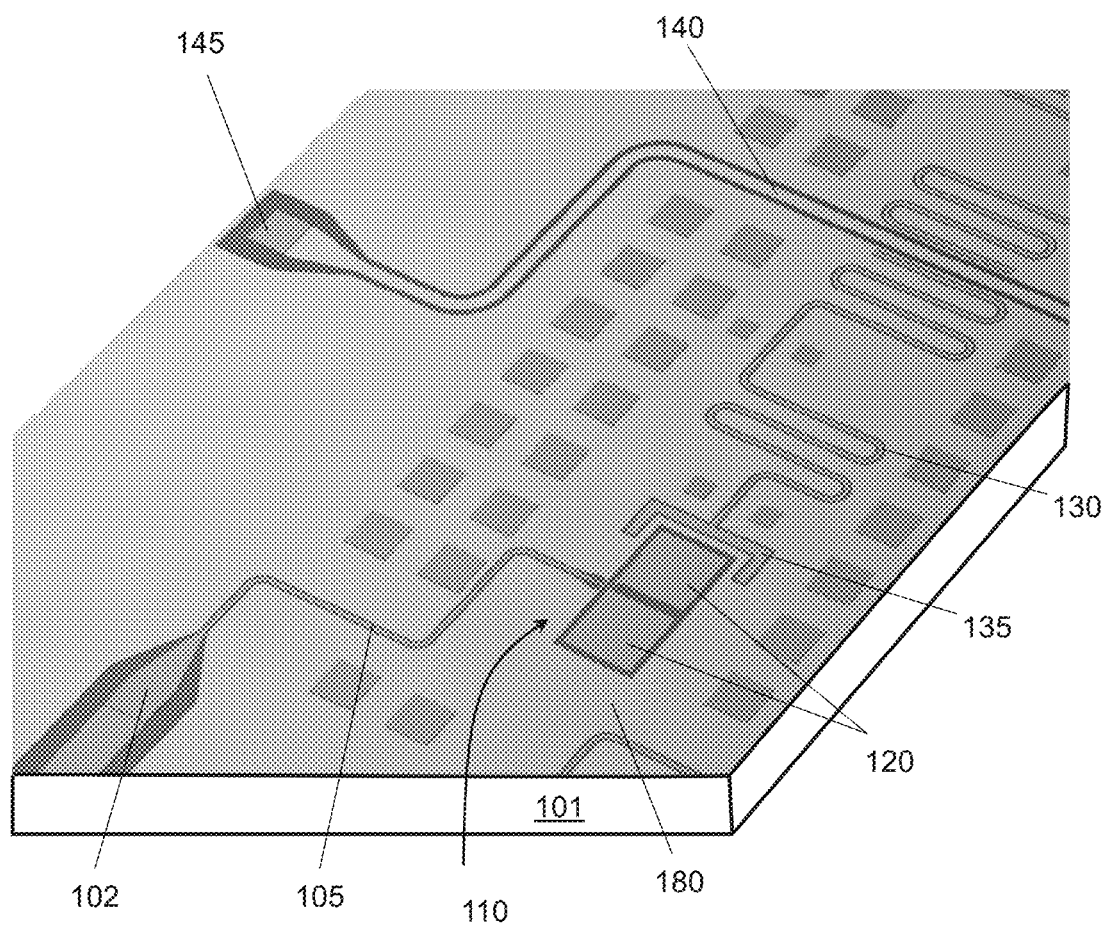
FIG. 1 shows a conventional qubit circuit formed using IC technology.

FIG. 1 depicts a conventional qubit circuit 110 formed using integrated circuit technology. Components of the qubit circuit are patterned on a substrate 101 located below the qubit circuit 110. A conductive layer can be formed on the substrate 101 that serves as an electric potential reference plane or ground 180. The qubit circuit 110 includes two capacitive paddles 120 that are patterned on the substrate. Between two corners of the capacitive paddles that are near an flux bias line 105 (which may be a flux bias line, for example) is a small integrated circuit that includes one or more Josephson junctions connected in a current loop comprising superconducting material. Features of the small integrated circuit are too small to be seen in the illustration of FIG. 1.

The flux bias line 105 can be used to inductively couple applied electromagnetic energy to the current loop of the qubit circuit 110. The applied energy may be used to tune an amount of magnetic flux flowing through the qubit's current loop and thereby establish a quantum-mechanical two-level system for the qubit. In some cases, a second flux bias line may be used to program the qubit into a desired pure state or superposition state. The flux bias line 105 connects to an address pad 102 that can be used to connect to external circuitry (e.g., via a wire bond). The flux bias line 105 and capacitive paddles 120 are separated from the ground plane 180 (not ohmically connected) by electrically insulating gaps between the conductive material for the ground plane and the conductive material(s) for the flux bias line 105 and capacitive paddles 120. The gaps can be formed using lithographic and microfabrication techniques.

The qubit circuit's quantum state can be read out using a readout resonator 130. For the example of FIG. 1, the resonator includes superconducting material patterned in a serpentine shape that extends across the substrate surface on a same side of the substrate as the qubit circuit 110. The superconducting material of the readout resonator 130 connects to a coupling capacitor 135 at one end and couples to a readout transmission line 140 at an opposing end. Electromagnetic energy in the qubit circuit 110 can couple to the readout resonator 130 through the coupling capacitor 135 (e.g., from a capacitive paddle 120 to the coupling capacitor 135). A signal in the resonator 130, indicative of a quantum state of the qubit, can be coupled onto the readout transmission line 140 (e.g., by inductive coupling). The readout transmission line 140 connects to a readout pad 145 for connecting and transmitting signals to external circuitry.

The readout resonator 130, coupling capacitor 135, and readout transmission line 140 have non-conductive separations (gaps) from the ground plane 180, though an end of the readout resonator connects to the ground plane. In some cases, the gaps are areas of the ground plane that have been etched away or cleared using conventional microfabrication techniques (e.g., some combination of metal deposition, photolithography, and an etching or lift-off process). In the cleared areas, the capacitive paddles 120, flux bias line 105, readout resonator 130, coupling capacitor 135, and readout transmission line 140 can be formed also using conventional microfabrication techniques. In some cases, the capacitive paddles 120, flux bias line 105, readout resonator 130, coupling capacitor 135, and readout transmission line 140 are formed from the same material as the ground plane 180, and the gaps are patterned and etched away leaving the desired structures. The small integrated circuit that contains Josephson junctions may have feature sizes well below one micron. For such small feature sizes, electron-beam lithography or deep-ultraviolet photolithography may be used to pattern the circuit components.

As mentioned above for FIG. 1, the structure of the qubit's small IC containing the Josephson junction(s) is so small compared to the capacitive paddles 120 that it cannot be clearly seen in the illustration. The capacitive paddles can, for example, have a length of 200 microns or more along an edge. The capacitive paddles 120, coupling capacitor 135, and readout resonator 130 occupy the vast majority of surface area required on the substrate 101 for the qubit and its readout circuitry. Reducing the area occupied by these components can allow an increase in density of qubit circuits on an IC chip.

Figure 2A:
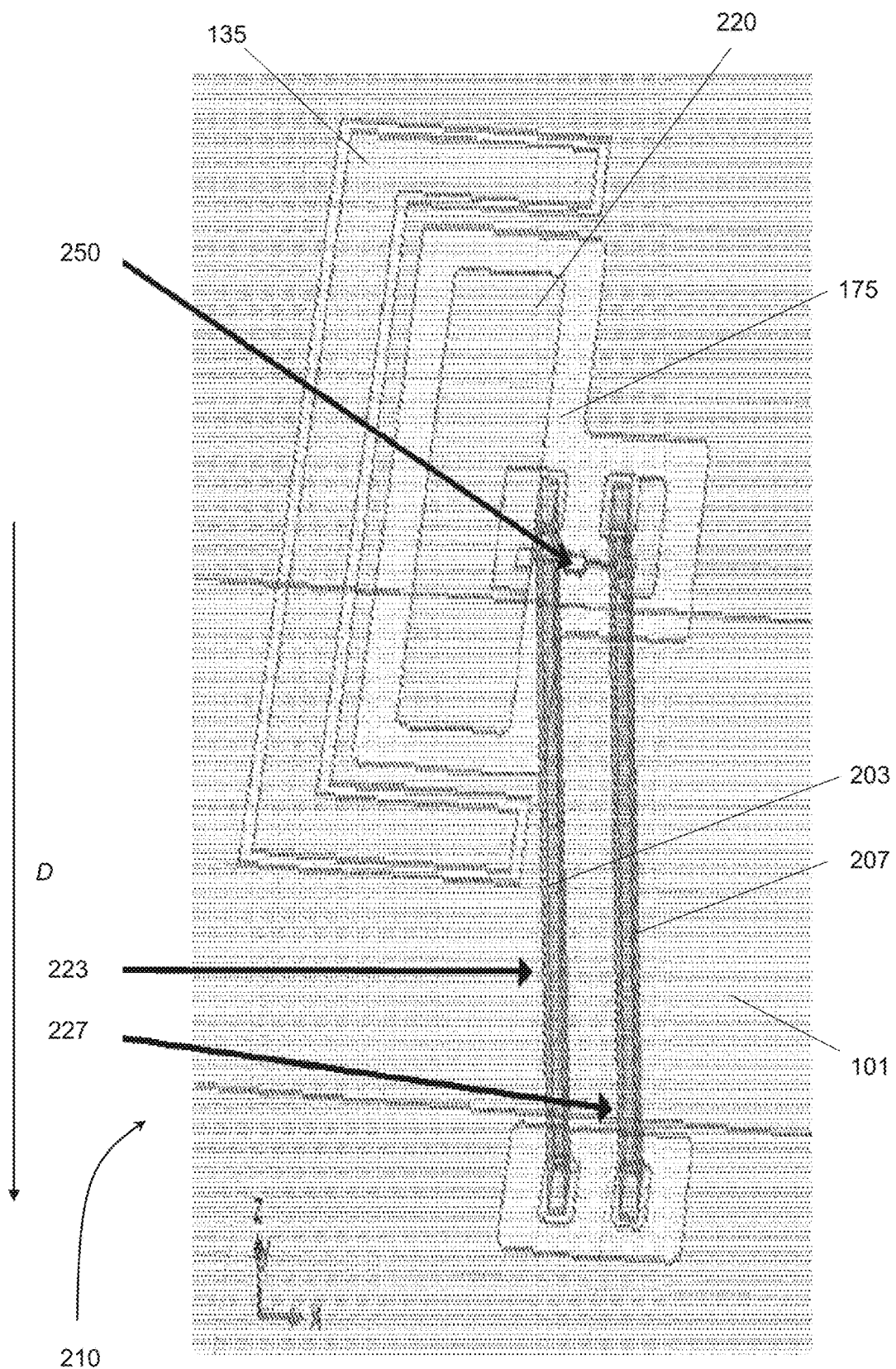
FIG. 2A is a perspective view of a qubit circuit having components formed deep in a substrate.

FIG. 2A depicts, in perspective and partially transparent view, an example of a qubit circuit 210 with deep, in-substrate components 223, 227 that extend a depth D into the substrate. In this example, the readout resonator and flux bias lines are not shown to simplify the drawing, though a coupling capacitor 135 for coupling to the readout resonator is shown. The illustrated qubit circuit 210 includes a smaller capacitive paddle 220 and the small integrated circuit 250 containing one or more Josephson junctions or other non-linear circuit elements in a current loop.

The qubit circuit 210 includes two deep vias 203, 207 that extend into the substrate 101 in the −z direction. The deep vias 203, 207 contain a conductor that may become superconducting when cooled to a suitable cryogenic temperature. The conductors in the deep vias 203, 207 can function as in-substrate capacitive components 223, 227 for the qubit circuit 210. For the illustrated implementation, a first capacitive component 223 couples capacitively to a second capacitive component 227, and both of the capacitive components connect to the one or more Josephson junctions in the integrated circuit 250. One of the capacitive components 223 also connects to a surface capacitive paddle 220, that can capacitively couples to the coupling capacitor 135.

The substrate 101 can be formed from a semiconductor material, such as silicon. Other types of substrates may be used in other implementations, provided deep cavities can be formed in the substrate. Other substrates may include germanium, silicon-germanium, silicon carbide, indium phosphide, gallium arsenide, gallium nitride, crystalline quartz, sapphire, diamond, and one or more types of ceramics.

The vias 203, 207 and their corresponding capacitive components 223, 227 can have a high aspect ratio, defined as a ratio of depth D of the via or component into the substrate (z direction) to a smallest transverse dimension (e.g., width W or length L) of the via or capacitive component in an x, y direction. The via's aspect ratio can be between 5:1 and 100:1. In some cases, the via can extend all the way through the substrate. The via's cross section may be in any suitable shape (e.g., round, square, rectangular, polygonal). When formed in a rectangular shape, the width W of the via can be between 2 microns and 40 microns and the length L of the via can be between 4 microns and 60 microns.

Vias, shown in FIG. 2A, are one type of cavity that can be used to form deep, in-substrate components for use with integrated quantum circuits. Deep, in-substrate components can be formed using other shaped cavities, such as straight trenches, curved trenches, zig-zag trenches, or angled trenches. Other shapes may have equally high aspect ratios and may have a length that is at least four times greater than a width of the cavity. The cavity formed in the substrate can be filled with a conductor, or alternatively can have a thin film of conductor deposited on interior walls of the cavity. In some cases, the conductor deposited in a cavity can have a thickness that is less than one-half of the smallest transverse dimension of the cavity. The cavity may be formed using lithographic patterning and deep reactive-ion etching (DRIE). An example DRIE process is the Bosch process. After etching is completed, the conductor can be deposited in the cavity using chemical vapor deposition (CVD), for example.

The conductor deposited in a cavity can be a material that becomes superconducting when cooled to an appropriate temperature. An example conductor that can be deposited in the cavity is titanium nitride (TiN), which can become superconducting below a temperature of 5.4 K. Other conductors may be used in some cases and may be metal alloys (e.g., $Nb_3Ge$) or pure metals such as aluminum, tantalum, hafnium, molybdenum, and niobium. For some implementations, a highly conductive material that does not become superconducting (such as copper or gold) may be used for at least some of the deep, in-substrate cavities. In some cases, the conductor is deposited to a thickness between 10 nanometers and 100 nanometers on interior walls of the cavity. The conductor deposited in the cavity may or may not be the same material that is used to form Josephson junctions or other circuit elements of the qubit circuit on the surface of the substrate 101. For example, two or more types of materials that become superconducting when cooled to an appropriate temperature may be used to form in-substrate components and surface components of a qubit circuit.

Qubit circuit components that extend deep into the substrate can include capacitive couplers (as depicted in FIG. 2A), inductive couplers, and conductive current loops connected to Josephson junctions (as described further below). The capacitive couplers and inductive couplers may be used for electromagnetic coupling within the qubit and/or to and from the qubit. Such components can be formed in deep vias, through-substrate vias (TSVs), and/or deep trenches that are etched into the substrate. As described above, forming components of a qubit circuit deep into the substrate can reduce an area of the substrate that is used for each qubit circuit. For the example circuit of FIG. 2A, one of the capacitive paddles can be removed because of the in-substrate capacitive component 227. There are additional benefits to using deep, in-substrate components for a qubit circuit. For example, the coupling strength to and from the qubit can be improved for interfacing operations such as manipulating qubit states, entangling qubits, and readout of qubits.

An additional benefit of using deep, in-substrate components for coupling to and from the qubit is that the coupling electromagnetic field can be located more within the substrate than across the surface of the substrate. Because of so-called "two-level systems" that are concentrated in ultra-thin interfacial layers that form at air/metal/substrate interfaces, losses may be higher for coupling electromagnetic fields that extend across the surface of the substrate compared to those that couple within the substrate where there is a significantly lower density of two-level systems. A reduction in loss mechanisms for a qubit circuit can provide greater stability for the qubit's quantum-mechanical state.

Figure 2B:
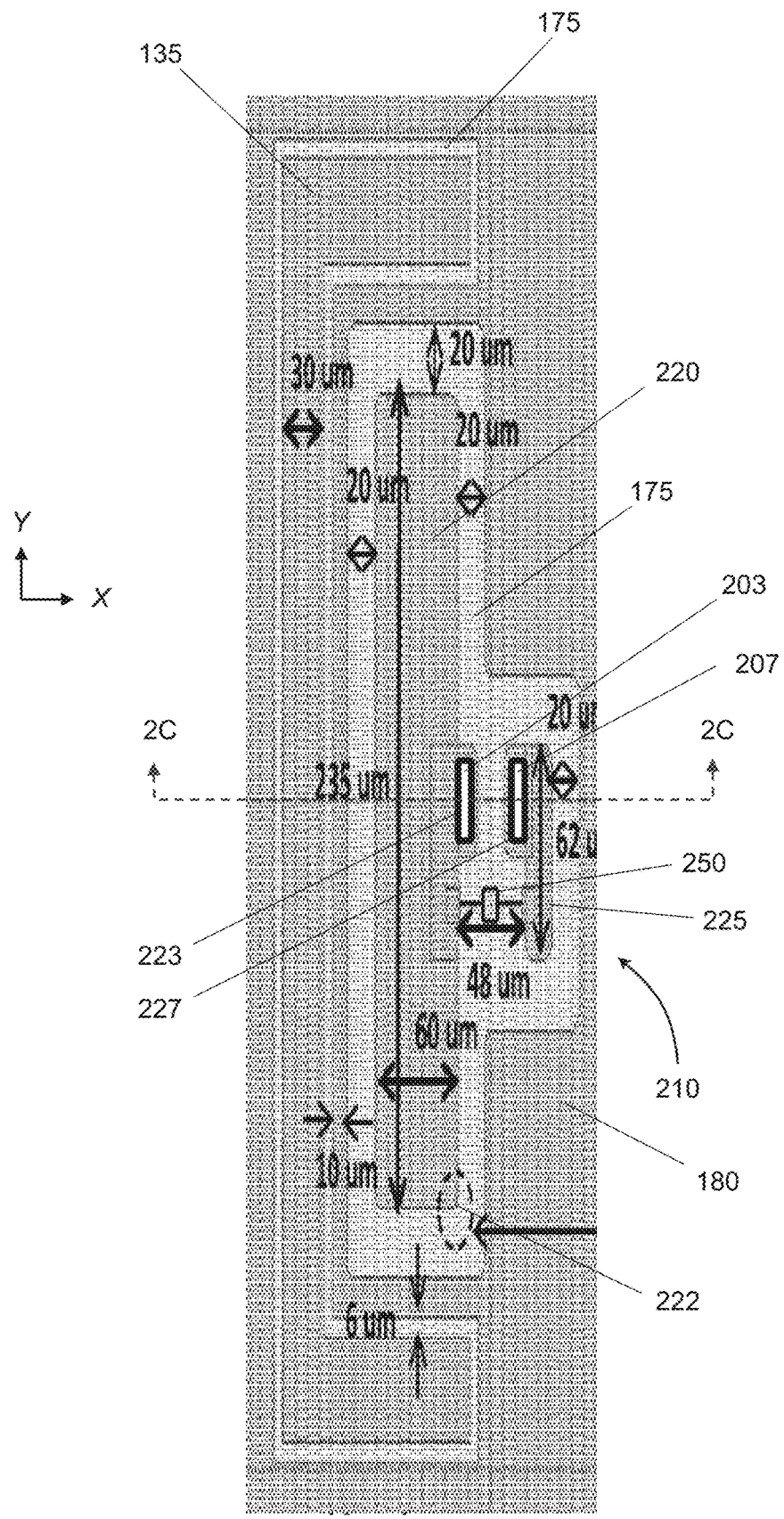
FIG. 2B is a plan view of the qubit circuit depicted in FIG. 2A.

FIG. 2B is a plan view of the qubit circuit 210 illustrated in FIG. 2A and shows further details of components on the top surface of the substrate 101. The vias 203, 207 extend into the substrate (−z direction) and are separated between 30 microns and 70 microns. Compared to the structure shown in FIG. 1, the area occupied by capacitive paddles on the surface of the substrate can be reduced from over 97,000 $\mu m^2$ to about 33,000 $\mu m^2$ or less by shrinking one capacitive paddle and moving capacitive coupling from the substrate surface to the interior of the via. More specifically, one of the two capacitive paddles 120 in FIG. 1 has been reduced in size (to capacitive paddle 220) but is retained to couple to the coupling capacitor 135 for readout of the qubit. The capacitive paddle 220 may have a length in the Y direction between 100 μm and 300 μm, and may have a width in the x direction between 30 μm and 100 μm. Each via 203, 207 may be rectangular and have a length in they direction between 10 μm and 30 μm, and may have a width in the x direction between 5 μm and 20 μm. The second capacitive paddle 120 in FIG. 1 has been essentially eliminated from the surface of the substrate for the qubit circuit 210 of FIG. 2A and is replaced by the conductor within the deep via. A small landing pad 225 may be used to connect the conductor in the via 207 to the integrated circuit 250 that contains the Josephson junction(s). Further reductions in the area of features patterned on the surface of the substrate are also possible, as described below in connection with other example implementations such as that in FIG. 6A.

Figure 2C:
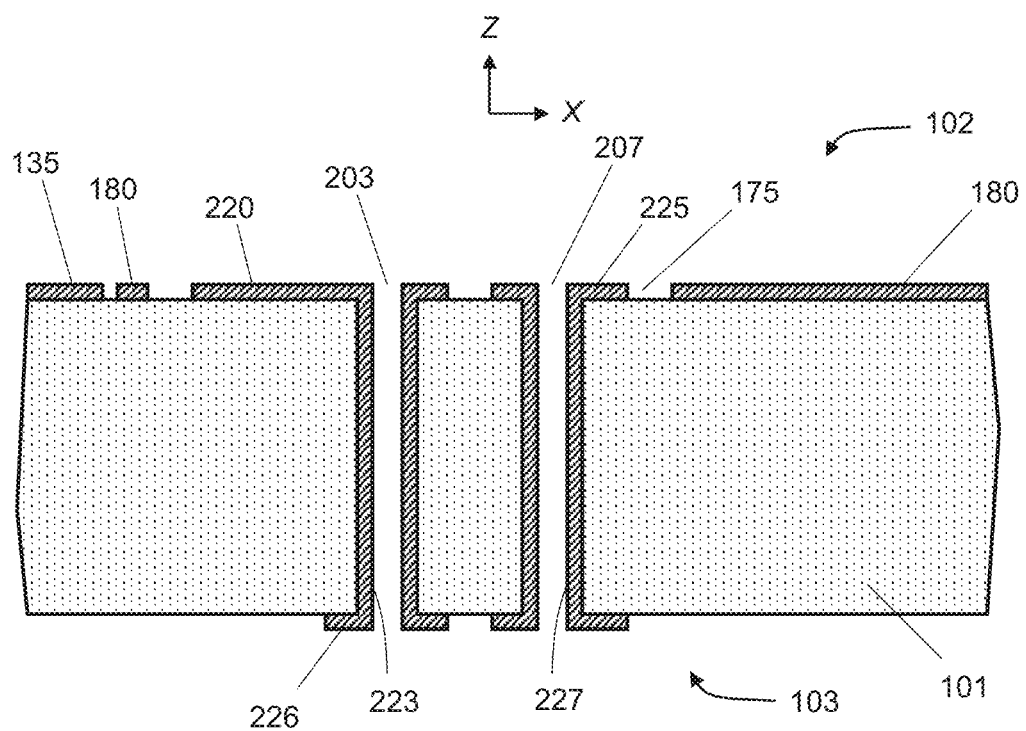
FIG. 2C is an elevation view of the qubit circuit shown in FIG. 2A.

FIG. 2C depicts an elevation view of the qubit circuit 210 of FIG. 2A. In this example, the vias 203, 207 extend all the way through the substrate 101 from a top or front surface 102 of the substrate to a bottom or back surface 103. Isolating gaps 175 in conductors between a reference or ground plane 180 and circuit components can be seen in FIG. 2C and other drawings. In this example, the conductors in the vias 203, 207 are deposited as a film that lines the interior walls of the vias to form capacitive components 223, 227, respectively. For example, the film may be deposited during a single conformal deposition process to coat the interior walls of the vias. In some cases, one or more films may be deposited to form conductors in the vias 203, 207.

There may be conductive landing pads 226 on a bottom surface 103 of the substrate 101 than connect to the capacitive components 223, 227.

Because the qubits may operate at radio frequencies in the GHz region (e.g., between 1 and 10 GHz), it can be beneficial to have the capacitive components 223, 227 extend into the substrate 101 rather than be disposed on the surface of the substrate. For capacitive components 223, 227 extending into the substrate 101, the electromagnetic fields emanating from the components can be confined to a smaller volume within a comparatively clean and uniform dielectric substrate rather than extending over a region of the substrate's top surface 102 that may include or be near other structures (e.g., bond wires, interconnects, features on another chip that is bonded to the qubit chip, etc.). These other structures can attenuate the electromagnetic waves more than the pure non-conducting substrate. In a qubit circuit, losses due to attenuation by these structures (along with losses from interfacial two-level systems described above) may decohere the qubit's state, which is undesirable for quantum computing applications. Another advantage of forming capacitive components into the substrate is that their entire surfaces can be placed closer together than coplanar capacitive paddles 120 that extend across a surface of the substrate, thereby increasing capacitive coupling between the capacitive components.

Figure 3:
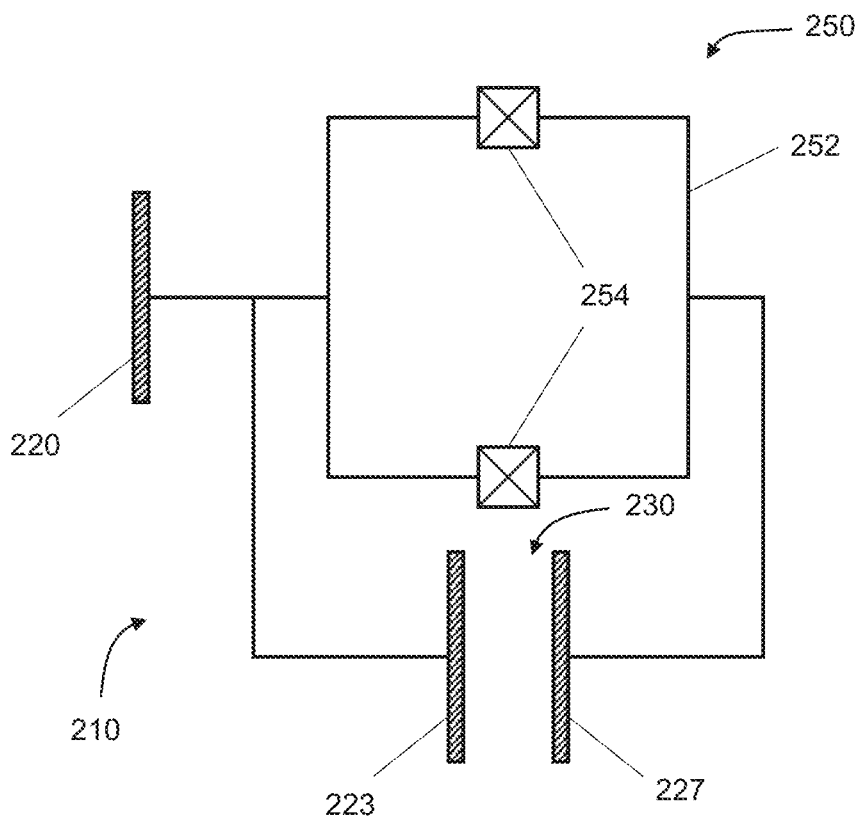
FIG. 3 is a simplified circuit schematic of the qubit circuit shown in FIG. 2A.

FIG. 3 shows a simplified circuit model of the qubit circuit 210 of FIG. 2A. The circuit model includes the small integrated circuit 250, which in this example comprises a current loop 252 formed from superconducting material and having two Josephson junctions 254 connected in the current loop. The current loop 252 connects, on one side of the Josephson junctions, to the first in-substrate capacitive component 223, and connects to the second in-substrate capacitive component 227 on an opposite side of the Josephson junctions. The in-substrate capacitive components 223, 227 can be thought of as electrodes of a shunting capacitor 230 that shunts opposite sides of the current loop 252. One side of the current loop 252 also connects to the capacitive paddle 220, which can be considered to be an electrode of a capacitor that is completed with the coupling capacitor 135. The effective inductance of the current loop 252 and capacitance of capacitive components 223, 227, 220 connected to the loop determine a resonance frequency for the qubit circuit's quantum-mechanical two-level system. The effective inductance of current loops 252 in a qubit circuit can have a value between 0.1 nanohenries and 20 nanohenries and may comprise geometric, kinetic, and Josephson inductance. The capacitance of capacitive components used in a qubit circuit can have a value between 30 femtofarad and 200 femtofarad. Although a current loop 252 is described for the qubit circuit, some implementations may not use a current loop and may use a single Josephson junction. In such cases, a bias line may not be used and the qubit may operate at a fixed frequency.

In operation at cryogenic temperatures, an electromagnetic field (e.g., initiated by a radio-frequency pulse or temporary DC current) can be applied to the qubit circuit 210 to affect current flow in its current loop 252. Typically, energy can be coupled to the loop inductively (e.g., by applying an RF pulse of current or a temporary DC current to a conductive trace that runs parallel to the current loop). The two lowest energy states of the loop can be used for the quantum-mechanical two-level system of the qubit. By applying RF pulses of electromagnetic energy and/or interacting with other qubits, the state of the qubit can be manipulated for quantum computations. For example, the two-level system can be placed in a desired quantum-mechanical superposition state, and then operations can be performed on and/or with the qubit. The state of the qubit can be sensed through capacitive paddle 220 for readout (e.g., after completion of a quantum computation). When electromagnetic energy is applied to the qubit, current and energy can flow in and out of the in-substrate components 223, 227. Because of this energy flow (and associated capacitance and/or inductance of the in-substrate components), the in-substrate components participate, at least in part, in establishing a two-level quantum-mechanical system for the qubit and determining the quantum state of the qubit.

Figure 4A:
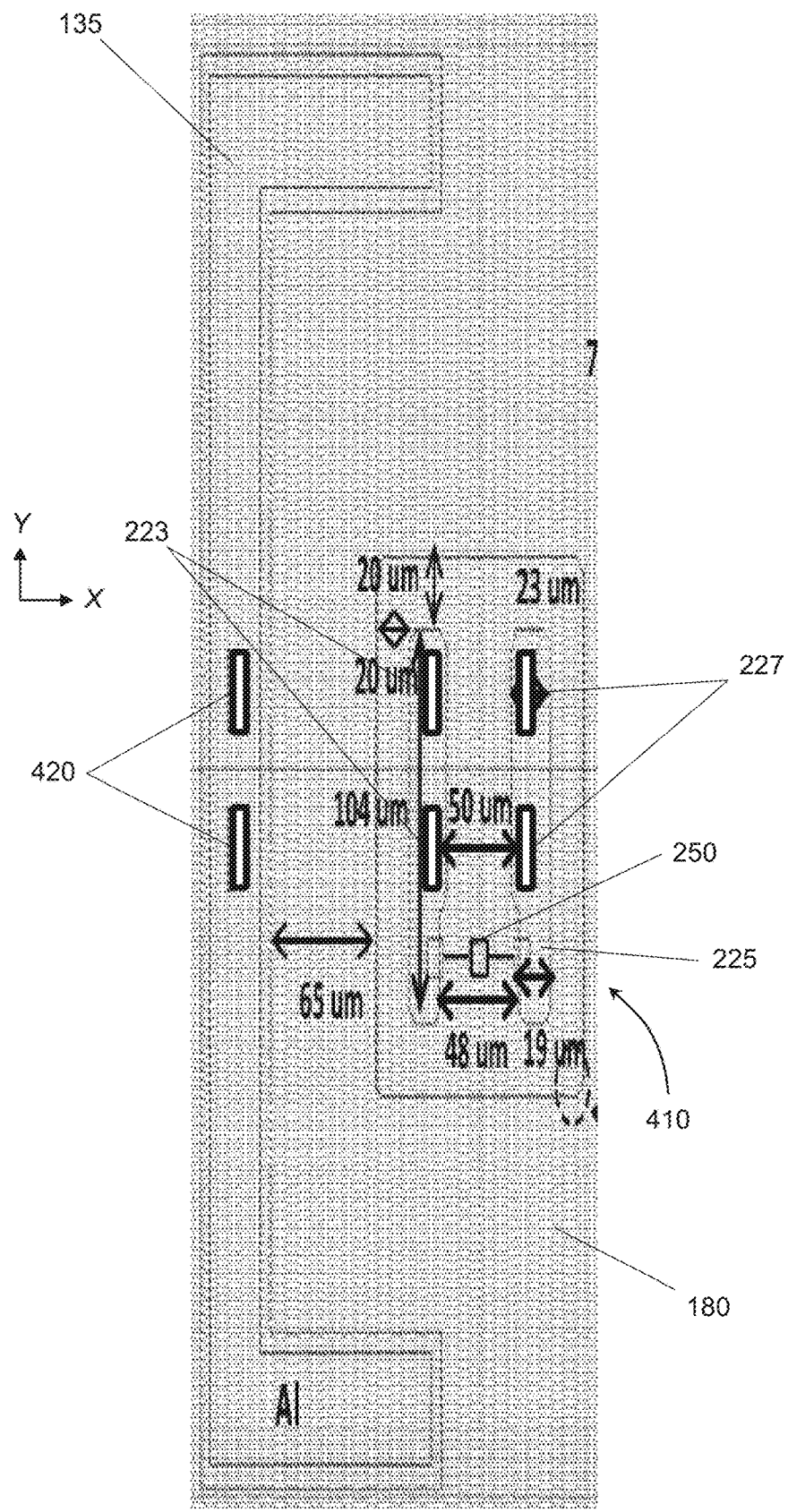
FIG. 4A is another example of a qubit circuit, in plan view, having components formed deep in a substrate.

Although FIG. 2A depicts two cavities (vias 203, 207) formed into the substrate 101, there can be more than two cavities used in a qubit circuit. FIG. 4A illustrates an example qubit circuit 410 that includes four cavities (vias) formed into the substrate. The plan view shows the location of four vias that are etched into the underlying substrate to form the capacitive components 223, 227 connected to Josephson junctions in the qubit circuit 410. The embodiment of FIG. 4A can exhibit higher capacitive coupling between the pairs of capacitive components 223, 227. Additional cavities can increase capacitance of the in-substrate capacitive components, improve capacitive coupling between the capacitive components, and may further confine the electric field between the capacitive components within the substrate. More cavities can be used in a qubit circuit in some cases, and the inventive embodiments are not limited to a certain number of cavities formed in the substrate.

The qubit circuit 410 of FIG. 4A also includes capacitive components 420 formed in deep cavities in the underlying substrate. These capacitive components function as coupling capacitors that connect to the readout resonator (not shown in FIG. 4A). For example, capacitive components 420 can couple electromagnetic energy from capacitive components 223 that are connected in the qubit circuit 410.

For the implementation of FIG. 4A, the capacitive paddle 220 (shown in FIG. 2B) has been eliminated from the surface of the substrate. This is possible because coupling to the readout resonator can now be achieved within the substrate using capacitive components 223 and capacitive components 420. Although the surface-plate of the coupling capacitor 135 is shown in the illustration, it essentially performs no function and can be removed. By eliminating the second capacitive paddle, the area of the qubit circuit 410 can be reduced further from about 33,000 µm$^2$ to about 14,000 µm$^2$, which is about a factor of about 7 smaller than the circuit implementation depicted in FIG. 1. Additionally, the area of circuit components for the readout resonator can be substantially reduced due to the removal of the surface coupling capacitor 135.

Figure 4B:
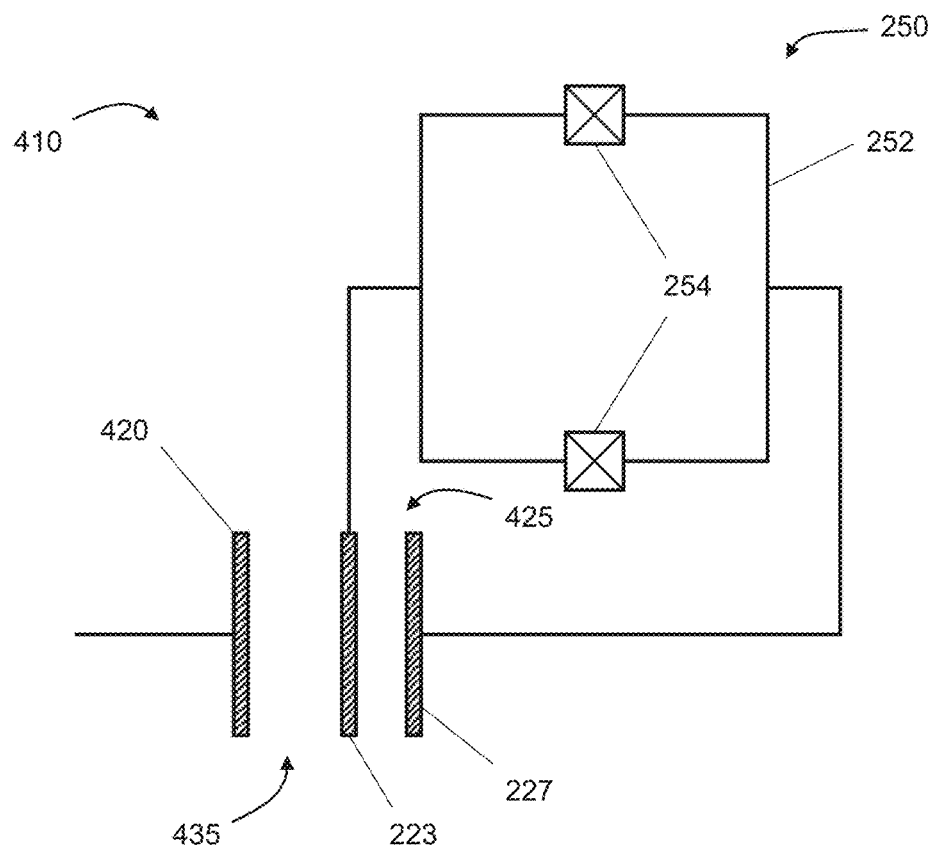
FIG. 4B is a simplified circuit schematic of the qubit circuit shown in FIG. 4A.

A circuit model for the implementation of FIG. 4A is depicted in FIG. 4B. The in-substrate capacitive components 223, 227 are modeled as electrodes of a first capacitor 425 that couples within the qubit circuit. The in-substrate capacitive components 223, 420 are modeled as electrodes of a second capacitor 435 that can couple to the readout resonator. A current loop 252 containing Josephson junctions connects between two capacitive components 223, 227.

Figure 5:
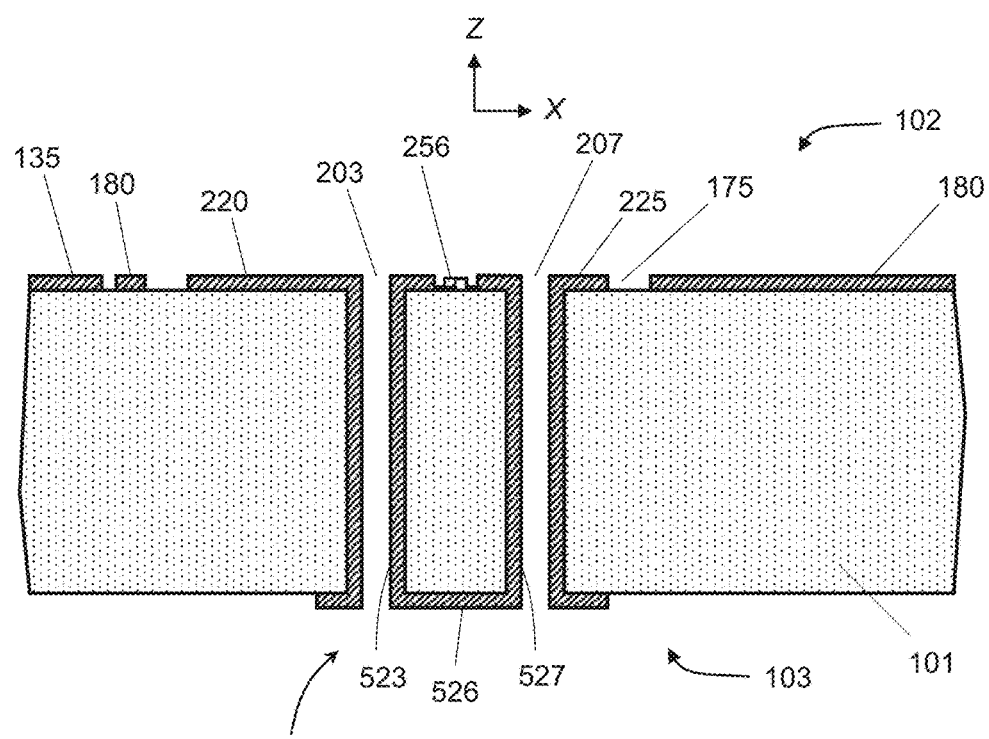
FIG. 5 is an elevation view showing two through-substrate vias than can be used to form a current loop in a qubit circuit.

Cavities formed into the substrate can be used for other circuit components and other functions and are not limited to only capacitive components. FIG. 5 depicts an example where two TSVs 203, 207 are used to form part of a current loop 552 that contains Josephson junctions. The current loop comprises conductors 523, 527 deposited in the TSVs that are connected together by a bottom surface landing 526. The Josephson junctions 256 can be patterned on the substrate's top surface 102 and connect to the conductors 523, 527 with top-surface interconnects.

Figure 6A:
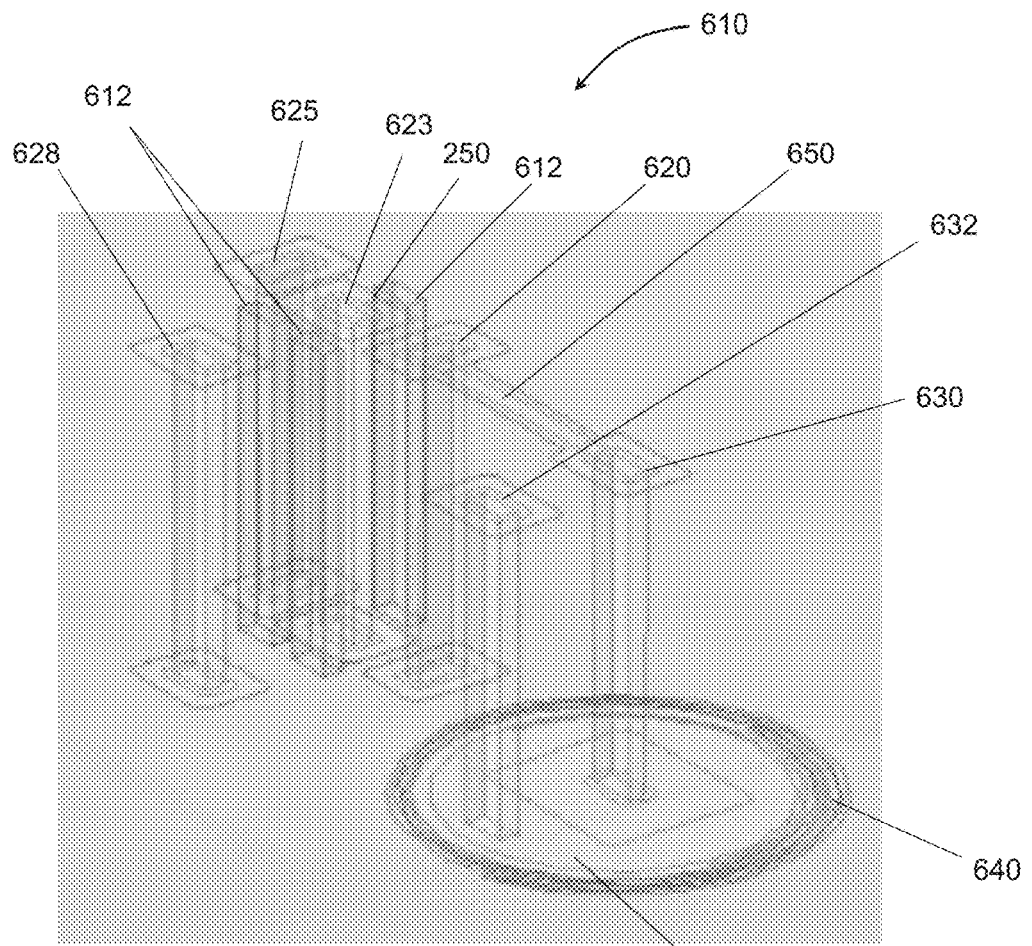
FIG. 6A is a perspective view of a qubit circuit that includes no surface capacitive plates on a top side of the substrate.
Figure 6B:
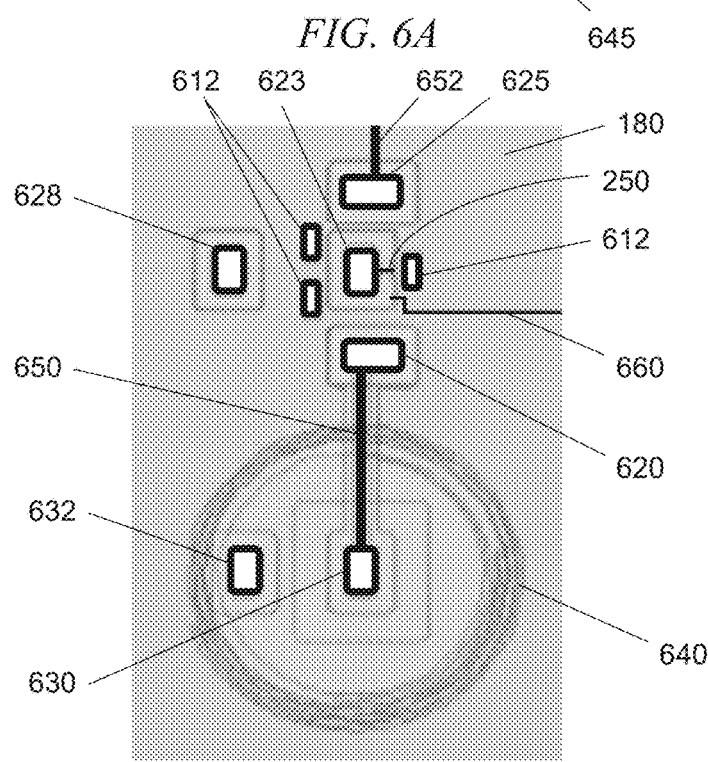
FIG. 6B is a plan view of the qubit circuit of FIG. 6A.

Various additional embodiments of qubit circuits are possible. FIG. 6A is a semi-transparent perspective view depicting a qubit circuit 610 that has no surface capacitive paddles for coupling electromagnetic energy to and from or within the qubit circuit. FIG. 6B is a semi-transparent plan view of the qubit circuit of FIG. 6A. The qubit circuit comprises a single in-substrate component 623 that provides capacitive to other in-substrate components patterned in the substrate. The qubit's in-substrate component 623 connects to an integrated circuit 250 (formed on an upper surface of the substrate) at one end that includes Josephson junctions in a current loop. The integrated circuit 250 can connect between the qubit's in-substrate component 623 and a ground plane 180 formed from a conductor deposited on the upper surface of the substrate. The qubit's in-substrate component 623 and integrated circuit 250 can form, at least in part, an LC resonator that defines a two-level quantum-mechanical system for the qubit circuit 610. To reduce noise capacitance to the in-substrate component, several grounding vias 612 can be formed around the qubit's in-substrate component 623. The grounding vias 612 can also add capacitance to an in-substrate component when located near the in-substrate component (e.g., within 40 microns). These grounding vias can be lined with a conductor that connects to the surface ground plane 180. The grounding vias 612 can be located between 20 microns and 40 microns (on center) from the qubit's in-substrate component 623. Because the grounding vias can provide electromagnetic screening, they can also be used to control an amount of capacitive coupling strength to and from the qubit.

There can be additional deep, in-substrate components 620, 625, 628 to interact with the qubit circuit and its two-level system. An in-substrate readout component 620 can be a capacitive component that provides coupling between the qubit's in-substrate component 623 and a readout resonator that is formed by two capacitively coupled resonator in-substrate components 630, 632, a capacitive surface plate 645, and a spiral conductive trace 640. A patterned conductive trace 650 on a surface of the substrate can connect the in-substrate readout component 620 to the resonator in-substrate component 630. The capacitive surface plate 645 and spiral conductive trace 640 can be patterned on an opposite side (e.g., bottom or back surface) of the substrate from the side on which the integrated circuit 250 is patterned. The spiral conductive trace 640 can provide inductance for the readout resonator. The resonator in-substrate components 630, 632 and capacitive surface plate 645 can provide capacitance for the readout resonator. The spiral conductive trace 640 can inductively couple to a readout transmission line (e.g., a conductive trace) that passes in close proximity (e.g., within 10 microns) to the spiral conductive trace 640. The in-substrate readout component 620 may be between 40 microns and 80 microns (on center) from the qubit's in-substrate component 623.

An in-substrate control component 628 can be used to program the qubit's two-level system to a desired superposition state or pure state. The grounding vias 612, the in-substrate control component 628 may not exhibit strong capacitive coupling to the qubit's in-substrate component 623. In this regard, the in-substrate component 623 of the qubit circuit provides both capacitive coupling (to the in-substrate readout component 620). Generally, an in-substrate component for a qubit circuit may provide capacitive coupling, inductive coupling, or both capacitive and inductive coupling. The in-substrate control component 628 may be between 50 microns and 100 microns (on center) from the qubit's in-substrate component 623.

An in-substrate coupling or inter-qubit component 625 may be included with a qubit circuit 610 on a substrate. The in-substrate coupling component can capacitively couple to the qubit's in-substrate component 623 and may be used to couple two or more qubit circuits together. For example, a conductive trace 652 can connect the in-substrate coupling component 625 to two or more in-substrate coupling components of two or more other qubit circuits integrated within the substrate. There can be capacitors formed on the surface of the substrate connected in series between the in-substrate coupling components 625 of different qubit circuits that are connected by the conductive trace. In some cases, the capacitors formed on the surface may be smaller in value and mainly determine the amount of capacitance between two coupled qubits. For example, the capacitance between the in-substrate coupling component 625 and a qubit's in-substrate component 623 may be on the order of 10 femtofarads or larger, whereas a capacitor formed on the surface of the substrate and located in series between the in-substrate coupling components 625 of two qubits that are connected by the conductive traces 652 may be on the order of 1 femtofarad. Hence, the capacitive coupling between the two qubits will be on the order of 1 femtofarad. The in-substrate coupling component 625 may be between 30 microns and 60 microns (on center) from the qubit's in-substrate component 623.

A qubit circuit 610 may also include a flux bias line 660 (depicted simply in FIG. 6B). The flux bias line 660 can carry a current along a path, which has a portion running parallel to a portion of the qubit's current loop. The amount of current carried by the flux bias line 660 may be up to 10 milliamps, though larger currents may be carried in some cases. The current applied to the flux bias line 660 can provide inductive coupling to the qubit's current loop and determine an amount of magnetic flux that penetrates the qubit circuit's current loop. This flux biasing of the current loop can establish the qubit's two-level, quantum-mechanical system.

FIG. 6A and FIG. 6B show the spiral conductive trace 640 and capacitive surface plate 645 of the readout resonator laterally displaced from the in-substrate readout component 620. In the illustrated implementations, these components are formed on an opposite side of the substrate from the qubit circuit's Josephson junctions. The displacement is used in the illustrated implementation, because the in-substrate components 623, 625, 628, and grounding vias 612 extend through the substrate to the substrate's opposite side. The in-substrate components 623, 625, 628, and grounding vias 612 may extend all the way or part way through the substrate (e.g., up to 50% through the substrate, up to 75% through the substrate, or up to 90% through the substrate). In such cases, the spiral conductive trace 640 and capacitive surface plate 645 may be located, at least in part, directly under the in-substrate readout component 620 and may extend directly under the qubit's integrated circuit 250, on the opposite side of the wafer. Accordingly, the amount of space occupied by a qubit circuit 610 and its readout resonator can be further reduced. In the illustrated example, the spiral conductive trace 640 is about 160 microns in diameter, and an amount of space occupied by the qubit circuit 610 and its readout resonator can be reduced to less than 10,000 square microns, most of which is taken up by the readout resonator's inductive component. With a single in-substrate component 623, the area of the qubit circuit can be reduced to less than 5000 square microns.

The readout resonator's inductive component can be formed using a plurality of deep, in-substrate cavities and conductors deposited in the cavities. Conductive traces on opposite sides of the cavities can connect the conductors in the cavities to form a serpentine pattern of in-substrate conductors and thereby produce an in-substrate inductive component for the readout resonator. This can further reduce an amount of surface area occupied by the qubit circuit and its readout resonator.

Figure 7A:
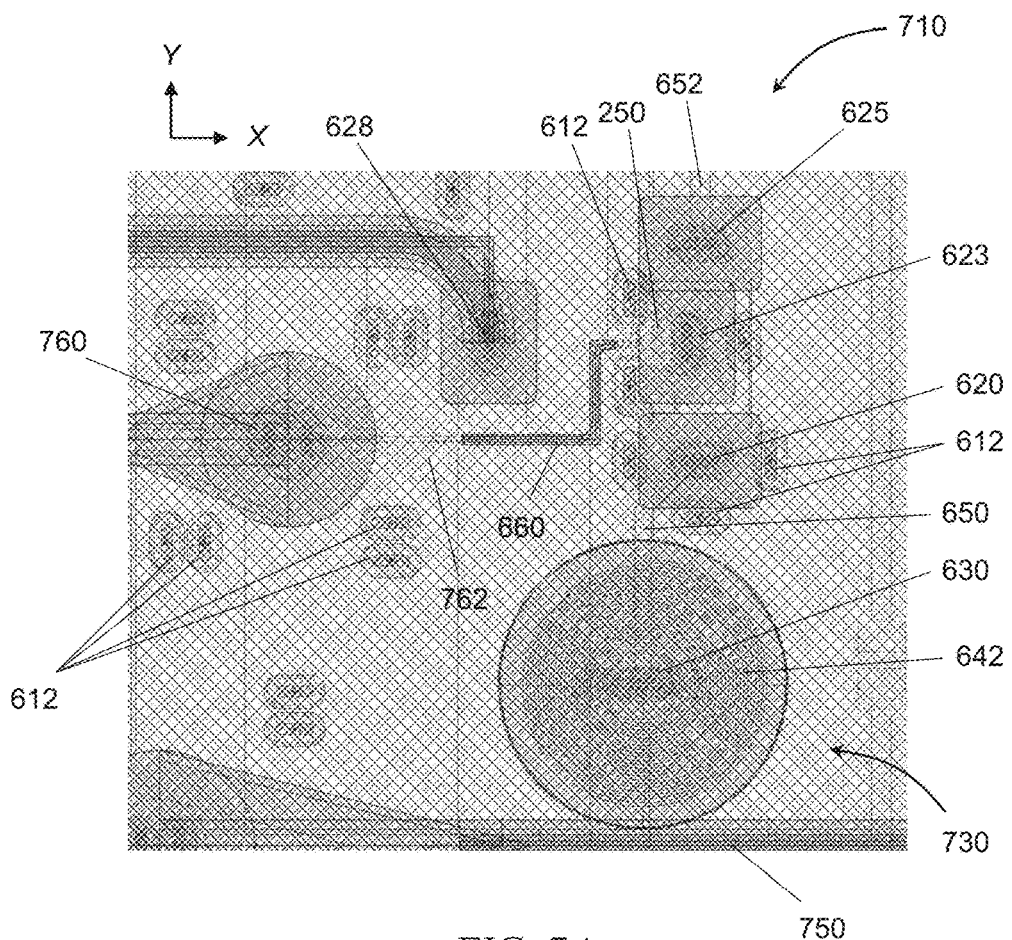
FIG. 7A depicts layout patterns for a qubit circuit and related components.

FIG. 7A depicts multilevel layout patterns for a qubit circuit 710, readout resonator 730, and related components that can be patterned on a substrate. For the illustrated embodiment, through-substrate vias are used to couple to and from the qubit circuit 710. The qubit circuit includes a single in-substrate component 623 connected to an integrated circuit 250 that includes one or more Josephson junctions. The qubit's in-substrate component 623 can couple capacitively to an in-substrate readout component 620 and an in-substrate coupling component 625. The in-substrate readout component 620 can connect, by a patterned conductive trace 650 on a surface of the substrate, to the in-substrate resonator component 630 of the readout resonator 730. The readout resonator includes a spiral conductor 642 (inductive component of the readout resonator) patterned on an opposite surface of the substrate from the integrated circuit 250. The spiral conductor 642 may have more turns that cover a majority of the area within the spiral conductor's outer turn. In such cases, a surface capacitive plate may connect to the resonator in-substrate component 630 on a same side or opposite side of the substrate as the integrated circuit 250 to provide capacitance for the readout resonator. Alternatively or additionally, the resonator in-substrate component 630 alone or in combination with one or more other in-substrate components (such as the readout component 620 and grounding vias 612 adjacent to the readout component) may provide enough capacitance for the readout resonator 710. The spiral conductor 642 is located in close proximity to a readout transmission line 750, so that signals in the readout resonator can be inductively coupled from the spiral conductor 642 to the readout transmission line 750.

For the implementation shown in FIG. 7A, the flux bias line 660 connects to two parallel through-substrate vias 760. At one end, the flux bias line connects through a tapered conductive portion 762 to landings of the through-substrate vias 760. The tapered portion 762 provides improved impedance matching between the through-substrate vias and the flux bias line, so that high-speed switching of flux bias can be possible (e.g., switching speeds between 1 nanosecond and 10 microseconds). In that regard, tapered portions may be included between any conductive via and a conductive trace patterned on a surface of the substrate. At an opposite end, the flux bias line 660 passes a current through a conductive trace that is located in close proximity to, and inductively couples to, the current loop of the qubit's integrated circuit 250, as described above. In some cases, a DC current applied to the flux bias line 660 (typically between 0.5 mA and 10 mA) is used to tune a resonant frequency of the qubit circuit 610 and thereby control an amount of coupling between the qubit circuit and one or more other qubit circuits integrated within the substrate. By quickly changing an amount of applied current in the flux bias line, one can quickly change coupling strength and interaction between qubits.

FIG. 7A also depicts a plurality of grounding vias 612 located in areas of the substrate away from the qubit circuit 710. In some cases, grounding vias 612 can be added to provide electromagnetic shielding around in-substrate components and or the qubit's Josephson junction(s). Additionally or alternatively, grounding vias can be added to further provide electromagnetic shielding and to mitigate accumulated stress in the wafer at other locations in the wafer. For example, additional grounding vias may be located and oriented with their long axes in different directions (as shown around the two parallel through-substrate vias 760) to provide shielding and mitigate accumulated wafer stress. For example, some grounding vias 612 may have their long axes oriented along a first direction (e.g., the x direction) and some of the grounding vias 612 may have their long axes oriented along a second direction (e.g., the y direction). In some cases, some vias may have their long axes oriented in additional other directions, or the long axes of grounding vias may be oriented randomly across the substrate.

Figure 7B:
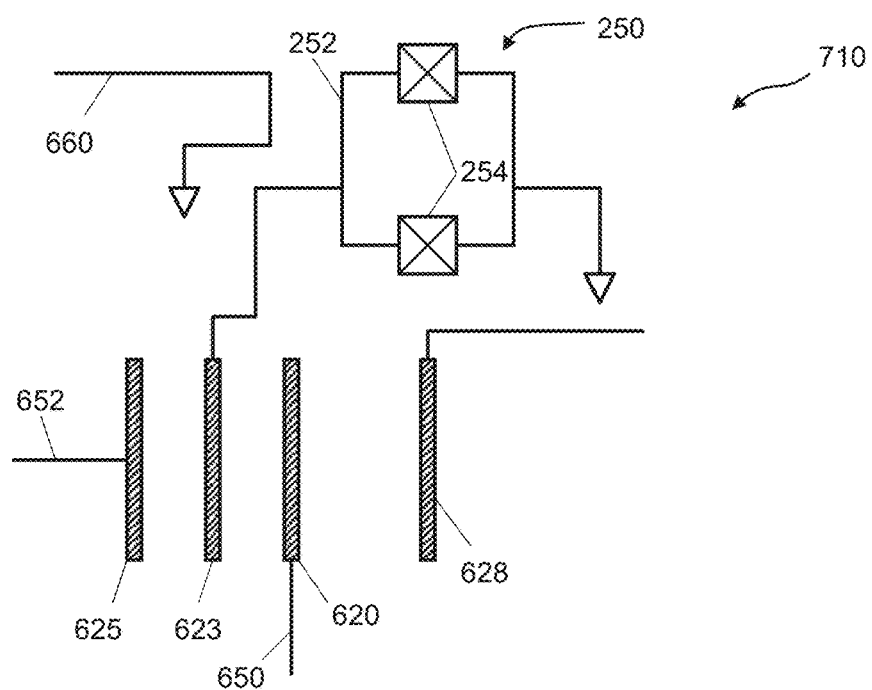
FIG. 7B is a simplified circuit schematic of the qubit circuit shown in FIG. 7A.

FIG. 7B depicts a simplified circuit model for the components shown in FIG. 7A. The circuit model depicts the current loop 252 of the qubit circuit, with its Josephson junctions 254, grounded on one side. For example, the current loop may connect on one side to the ground plane 180 on the surface of the substrate. The other side of the current loop 252 connects to the qubit's in-substrate component 623, which is depicted as a capacitor electrode 623. In a more detailed circuit model, the in-substrate component 623 can be represented as a transmission line having distributed capacitance and inductance. The in-substrate readout component 620, in-substrate coupling component 625, and in-substrate control component 628 are each depicted as electrodes of capacitors that have a mating electrode 623 of, and couple to, the qubit's in-substrate component 623. The flux bias line 660 is depicted as a single conductive trace that passes in close proximity (e.g., within 50 microns) to the current loop 252 of the qubit's integrated circuit 250.

Figure 8:
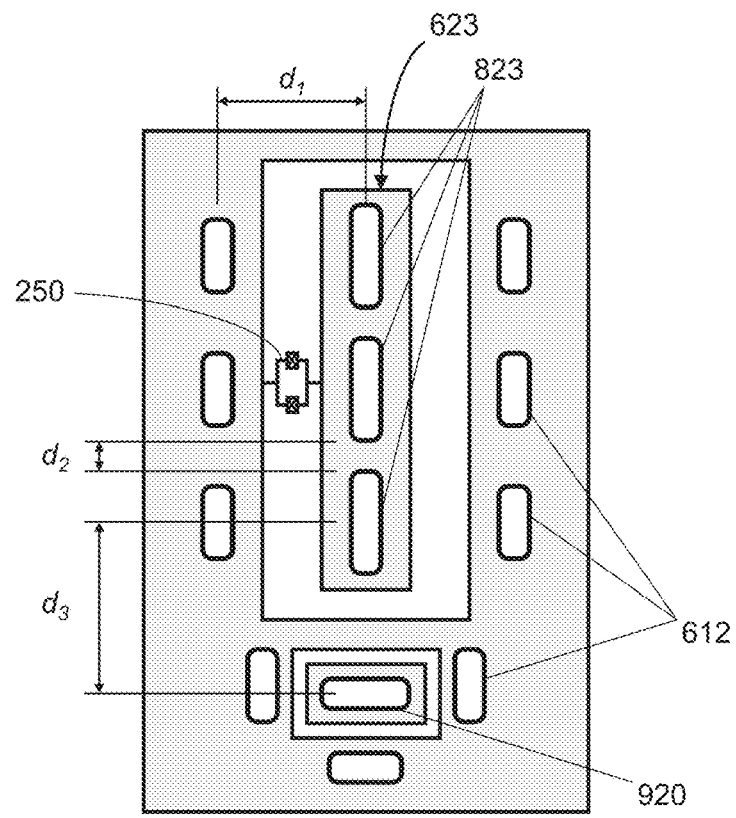
FIG. 8 depicts a qubit circuit that uses multiple deep cavities that are connected together on one side of the qubit circuit's current loop.

Although the single in-substrate component 623 is depicted as a single via connected to one side of the qubit's current loop in the embodiments of FIG. 6A and FIG. 7A, it can comprise two or more vias or trenches. FIG. 8 depicts an implementation where three in-substrate components 823 are used to form the qubit's in-substrate component 623. When multiple vias or trenches are used, they may be connected together (e.g., with a conductive layer on the surface of the substrate) to essentially form a single electrode of a capacitor. Mating electrodes of the capacitor can be grounding trenches or vias 612 located alongside the in-substrate components 823. A center-to-center distance $d_1$ between vias or trenches of the qubit's in-substrate component 623 and mating grounding trenches or vias 612 can be between 40 microns and 150 microns and may depend upon the number of vias or trenches used for the qubit's in-substrate component 623. A distance $d_2$ between nearest edges of the in-substrate components 823 can be between 10 microns and 20 microns. A center-to-center distance $d_3$ between an in-substrate component 823 of the qubit's in-substrate component 623 and an in-substrate component 920 to which the qubit's in-substrate component 623 capacitively and/or inductively couples can be between 40 microns and 100 microns.

Figure 9:
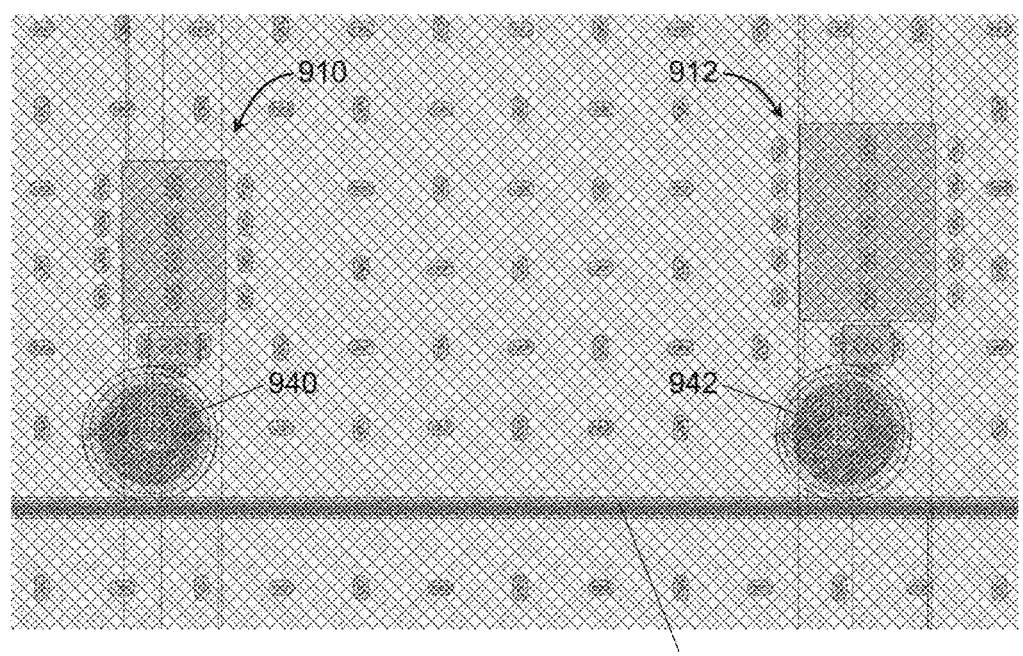
FIG. 9 depicts two qubit circuits that inductively couple to a same readout transmission line.

FIG. 9 depicts an example of a first qubit circuit 910 and a second qubit circuit 912 that couple to a same readout transmission line 750. A spiral inductor 940 of the first qubit circuit's readout resonator can inductively couple to the readout transmission line 750, and a spiral inductor 942 of the second qubit circuit's readout resonator can inductively couple to the same readout transmission line 750. To keep the signals distinct for each qubit circuit, the readout resonators for each qubit circuit can be designed to have different resonant frequencies. Accordingly, there can be more than two qubit circuits that couple to and are read out using a same readout transmission line 750.

Figure 10:
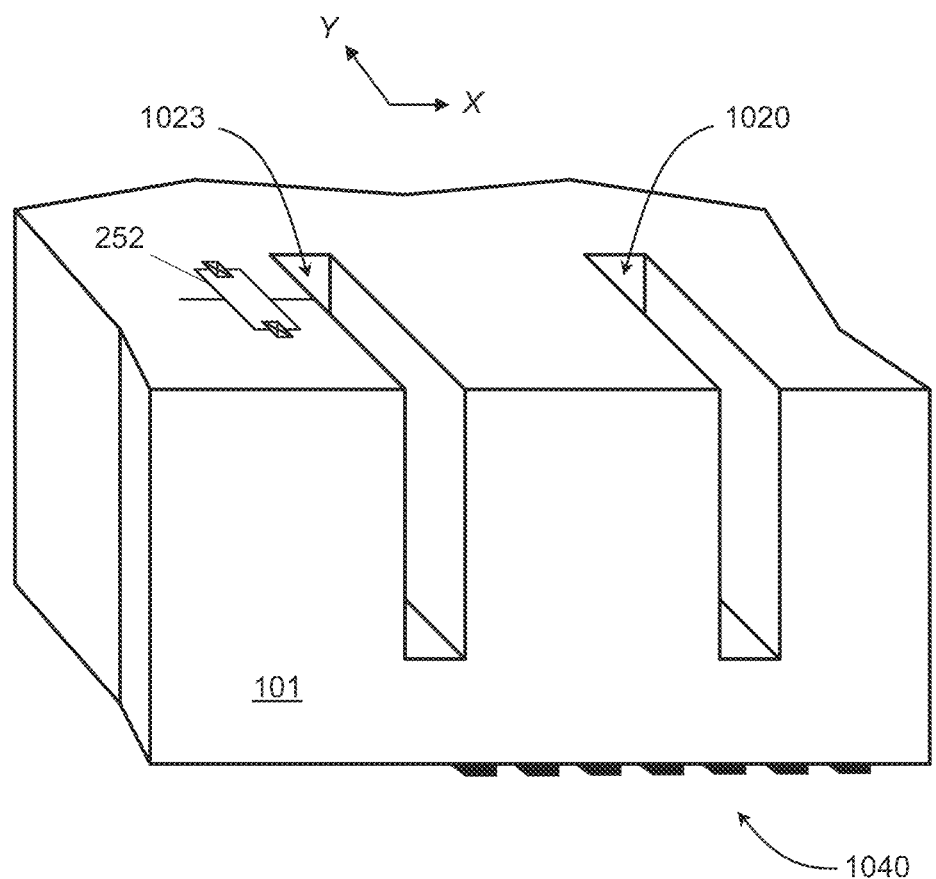
FIG. 10 depicts two trenches formed part way into a substrate that can be used in a qubit circuit.

FIG. 10 depicts a portion of a substrate 101 having two trenches that may be used to form deep, in-substrate components for a qubit circuit. A first trench can be used, for example, to form a qubit's in-substrate component 1023 that connects to a current loop 252 of the qubit's integrated circuit. A second trench can be used to form an in-substrate readout component 1020, for example, that provides coupling from the qubit to a readout resonator. In the illustrated implementation, the trenches extend part way into the substrate, as described above, so that conductive traces 1040 of a readout resonator's inductive component can be located, at least in part, directly opposite components of the qubit circuit. The trenches may have an aspect ratio between 5:1 and 100:1, which is a ratio of the depth of the trench to the trench's narrowest transverse dimension (measured in the x direction for the illustrated implementation). As with the vias described above, the trenches can be coated with a layer of conducting or superconducting material or may be filled with the material. In some cases, vias may be used for some deep, in-substrate components of a qubit circuit and trenches may be used for some deep, in-substrate components of the qubit circuit.

The spiral inductors depicted for the readout resonators above may have any suitable number of turns. For example, there may be between 2 and 25 turns for a spiral inductor. The width of a trace patterned for the spiral conductor can be between 200 nanometers and 5 microns. The readout resonators are not limited to spiral inductors, and other shapes of patterned conductive traces may be used, such as a serpentine pattern (illustrated in FIG. 1). Other inductive structures can include a boustrophedonic patterned trace that may fill any shape (e.g., square, rectangular, circle, oval, polygon, etc.).

Although the above qubit circuits have been described as containing Josephson junctions, the qubit circuits may contain other circuit elements alternatively or additionally. For example, qubit circuits that include deep, in-substrate components can also include or be integrated with traveling wave amplifiers, circulators, or parametric amplifiers.

Various configurations of qubit circuits may be implemented. Some example configurations are listed below.

(1) A qubit circuit for preparing quantum states for quantum computing, the qubit circuit comprising: a substrate; a circuit element formed, at least in part, from a first superconducting material patterned on the substrate; and a first conductor electrically connected to the circuit element and deposited in a first cavity extending into the substrate, the first cavity having an aspect ratio between 5:1 and 100:1, wherein the aspect ratio is a ratio of a depth of the first cavity into the substrate to a smallest transverse dimension of the first cavity.

(2) The qubit circuit of configuration (1), wherein the first cavity is a through-substrate via (TSV).

(3) The qubit circuit of configuration (2), wherein the circuit element comprises a Josephson junction and the first conductor in the TSV forms a capacitive element that is connected to the circuit element.

(4) The qubit circuit of any one of configurations (1) through (3), wherein the first cavity has a length that is at least four times longer than a width of the first cavity.

(5) The qubit circuit of any one of configurations (1) through (4), wherein the first conductor determines, at least in part, in which of the quantum states the qubit circuit resides after an electromagnetic field is applied to place the qubit circuit in a quantum state.

(6) The qubit circuit of any one of configurations (1) through (5), wherein the first conductor forms part of a current loop that includes the circuit element and the circuit element comprises a Josephson junction.

(7) The qubit circuit of configuration (6), further comprising an inductive element that inductively couples to the current loop when operating to apply an electromagnetic field to the qubit circuit and establish an amount of magnetic flux penetrating the current loop.

(8) The qubit circuit of any one of configurations (1) through (3), further comprising a second conductor in a second cavity that extends into the substrate, wherein the first conductor in the first cavity capacitively couples to the second conductor in the second cavity during operation of the qubit circuit.

(9) The qubit circuit of configuration (8), wherein the second conductor is electrically connected to the circuit element.

(10) The qubit circuit of configuration (8), wherein the second conductor is electrically connected to a readout resonator.

(11) The qubit circuit of claim 10, wherein the readout resonator comprises a spiral conductive trace that overlaps an area occupied by the qubit circuit on the substrate.

(12) The qubit circuit of any one of configurations (1) through (11), wherein the first conductor is formed from a second superconducting material.

(13) The qubit circuit of configuration (12), wherein the first conductor forms a layer of material on interior walls of the first cavity and has a thickness less than one-half a smallest transverse dimension of the first cavity.

(14) The qubit circuit of configuration (12) or (13), wherein the first conductor is formed from titanium nitride and the substrate comprises silicon.

(15) The qubit circuit of any one of configurations (1) through (14), wherein the depth of the first cavity into the substrate is between 50 microns and 500 microns.

(16) The qubit circuit of any one of configurations (1) through (15), further comprising a second conductor deposited in a second cavity formed in the substrate and electrically connected to an electric potential reference plane to provide a reference potential when the qubit circuit is operating.

(17) The qubit circuit of configuration (16), wherein the second conductor in the second cavity forms, at least in part, an electromagnetic shield for the qubit circuit.

Various methods for operating qubit circuits may be practiced for the above-described implementations. Some example methods are listed below.

(18) A method of operating a qubit circuit for quantum computing, the method comprising: applying first electromagnetic energy to the qubit circuit that includes a circuit element formed, at least in part, from a superconducting material, wherein the circuit element is formed on a substrate; and delivering at least some of the first electromagnetic energy to a first conductor deposited in a first cavity that extends into the substrate and is electrically connected to the circuit element, wherein the first cavity has an aspect ratio between 5:1 and 100:1 and wherein the aspect ratio is a ratio of a depth of the first cavity into the substrate to a smallest transverse dimension of the first cavity.

(19) The method of (18), wherein the first cavity is a through-substrate via (TSV).

(20) The method of (18) or (19), further comprising coupling second electromagnetic energy capacitively from the first conductor in the first cavity to a second conductor in a second cavity that extends into the substrate.

(21) The method of (20), further comprising establishing, at least in part, a quantum-mechanical two-level system for the qubit circuit with the first conductor and the second conductor.

(22) The method of (20) or (21), further comprising exciting a resonance in a readout resonator that is electrically connected to the second conductor to read out a state of the qubit circuit.

(23) The method of any one of (18) through (22), further comprising capacitively coupling the first electromagnetic energy from a second conductor to the first conductor, wherein the second conductor is located in a second cavity that extends into the substrate.

Additional configurations of qubit circuits are listed below. These configurations may include any feature(s) of the above configurations and may be operated according to the methods described above.

(24) A circuit for quantum computing, the circuit comprising: a silicon substrate; a Josephson junction formed on the silicon substrate; a capacitive element comprising a first conductor deposited in a first cavity and electrically connected to the Josephson junction, wherein the first cavity extends into the silicon substrate and has an aspect ratio between 5:1 and 100:1, and wherein the aspect ratio is a ratio of a depth of the first cavity into the silicon substrate to a smallest transverse dimension of the first cavity; and a second conductor deposited in a second cavity and electrically connected to a readout resonator, wherein the second cavity extends into the silicon substrate and has an aspect ratio between 5:1 and 100:1, and wherein the second conductor capacitively couples to the first conductor when the circuit is operating and wherein the first conductor and second conductor are formed from a superconducting material.

(25) The circuit of configuration (24), wherein an area of the substrate occupied by the qubit circuit is no larger than 5000 µm2.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the components so conjoined, i.e., components that are conjunctively present in some cases and disjunctively present in other cases. Multiple components listed with "and/or" should be construed in the same fashion, i.e., "one or more" of the components so conjoined. Other components may optionally be present other than the components specifically identified by the "and/or" clause, whether related or unrelated to those components specifically identified. Thus, as a non-limiting example, a reference to "A and/or B", when used in conjunction with open-ended language such as "comprising" can refer, in one embodiment, to A only (optionally including components other than B); in another embodiment, to B only (optionally including components other than A); in yet another embodiment, to both A and B (optionally including other components); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of components, and, optionally, additional unlisted items. Only terms clearly indicated to the contrary, such as "only one of" or "exactly one of," or, when used in the claims, "consisting of," will refer to the inclusion of exactly one component of a number or list of components. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more components, should be understood to mean at least one component selected from any one or more of the components in the list of components, but not necessarily including at least one of each and every component specifically listed within the list of components and not excluding any combinations of components in the list of components. This definition also allows that components may optionally be present other than the components specifically identified within the list of components to which the phrase "at least one" refers, whether related or unrelated to those components specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including components other than B); in another embodiment, to at least one, optionally including more than one, B, with no A present (and optionally including components other than A); in yet another embodiment, to at least one, optionally including more than one, A, and at least one, optionally including more than one, B (and optionally including other components); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A qubit for preparing quantum states for quantum computing, the qubit comprising:
   a substrate;
   a circuit element formed, at least in part, from a first superconducting material patterned on the substrate; and
   a first conductor electrically connected to the circuit element and deposited in a first cavity extending into the substrate, the first cavity having an aspect ratio between 5:1 and 100:1, wherein the aspect ratio is a ratio of a depth of the first cavity into the substrate to a smallest transverse dimension of the first cavity.

2. The qubit of claim 1, wherein the first cavity is a through-substrate via (TSV).

3. The qubit of claim 2, wherein the circuit element comprises a Josephson junction and the first conductor in the TSV forms a capacitive element that is connected to the circuit element.

4. The qubit of claim 1, wherein the first cavity has a length that is at least four times longer than the smallest transverse dimension of the first cavity.

5. The qubit of claim 1, wherein when the qubit is operating the first conductor determines, at least in part, in which of the quantum states the qubit resides in response to application of an electromagnetic field to the qubit to place the qubit in a quantum state.

6. The qubit of claim 1, wherein the first conductor forms part of a current loop that includes the circuit element and the circuit element comprises a Josephson junction.

7. The qubit of claim 6, further comprising an inductive element that inductively couples to the current loop when operating to apply an electromagnetic field to the qubit and establish an amount of magnetic flux penetrating the current loop.

8. The qubit of claim 1, further comprising a second conductor in a second cavity that extends into the substrate, wherein the first conductor in the first cavity capacitively couples to the second conductor in the second cavity during operation of the qubit.

9. The qubit of claim 8, wherein the second conductor is electrically connected to the circuit element.

10. The qubit of claim 8, in combination with a readout resonator formed on the substrate, wherein the readout resonator comprises the second conductor.

11. The qubit of claim 10, wherein the readout resonator further comprises a spiral conductive trace that overlaps an area occupied by the qubit on the substrate.

12. The qubit of claim 1, wherein the first conductor is formed from a second superconducting material.

13. The qubit of claim 12, wherein the first conductor forms a layer of material on interior walls of the first cavity and has a thickness less than one-half the smallest transverse dimension of the first cavity.

14. The qubit of claim 12, wherein the first conductor is formed from titanium nitride and the substrate comprises silicon.

15. The qubit of claim 1, wherein the depth of the first cavity into the substrate is between 50 microns and 500 microns.

16. The qubit of claim 1, further comprising a second conductor deposited in a second cavity formed in the substrate and electrically connected to an electric potential reference plane to provide a reference potential when the qubit is operating.

17. The qubit of claim 16, wherein the second conductor in the second cavity forms, at least in part, an electromagnetic shield for the qubit.

18. A method of operating a qubit for quantum computing, the method comprising:
   applying first electromagnetic energy to the qubit that includes a circuit element formed, at least in part, from a superconducting material, wherein the circuit element is formed on a substrate; and
   delivering at least some of the first electromagnetic energy to a first conductor deposited in a first cavity that extends into the substrate and is electrically connected to the circuit element, wherein the first cavity has an aspect ratio between 5:1 and 100:1 and wherein the aspect ratio is a ratio of a depth of the first cavity into the substrate to a smallest transverse dimension of the first cavity.

19. The method of claim 18, wherein the first cavity is a through-substrate via (TSV).

20. The method of claim 18, further comprising coupling second electromagnetic energy capacitively from the first conductor in the first cavity to a second conductor in a second cavity that extends into the substrate.

21. The method of claim 20, further comprising establishing, at least in part, a quantum-mechanical two-level system for the qubit with the first conductor and the second conductor.

22. The method of claim 20, further comprising exciting a resonance in a readout resonator that is electrically connected to the second conductor to read out a state of the qubit.

23. The method of claim 18, further comprising capacitively coupling the first electromagnetic energy from a second conductor to the first conductor, wherein the second conductor is located in a second cavity that extends into the substrate.

24. A circuit for quantum computing, the circuit comprising:
   a silicon substrate;

a qubit comprising:
- a Josephson junction formed on the silicon substrate; and
- a capacitive element comprising a first conductor deposited in a first cavity and electrically connected to the Josephson junction, wherein the first cavity extends into the silicon substrate and has an aspect ratio between 5:1 and 100:1, and wherein the aspect ratio is a ratio of a depth of the first cavity into the silicon substrate to a smallest transverse dimension of the first cavity; and a readout resonator comprising a second conductor deposited in a second cavity that extends into the silicon substrate and has an aspect ratio between 5:1 and 100:1, and wherein the second conductor capacitively couples to the first conductor when the circuit is operating and wherein the first conductor and second conductor are formed from a superconducting material.

25. The circuit of claim 24, wherein a surface area extending across the silicon substrate that is occupied by the qubit is no larger than 5000 $\mu m^2$.

* * * * *